United States Patent
Lin

(10) Patent No.: US 8,488,313 B2
(45) Date of Patent: Jul. 16, 2013

(54) CONTAINER DATA CENTER HAVING HIGH HEAT DISSIPATING EFFICIENCY

(75) Inventor: Tai-Wei Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 127 days.

(21) Appl. No.: 13/278,191

(22) Filed: Oct. 21, 2011

(65) Prior Publication Data
US 2013/0050935 A1 Feb. 28, 2013

(30) Foreign Application Priority Data
Aug. 30, 2011 (TW) .............................. 100130992 A

(51) Int. Cl.
*H05K 7/20* (2006.01)

(52) U.S. Cl.
USPC ... 361/679.5; 361/695; 361/724; 361/679.49; 454/184

(58) Field of Classification Search
USPC ............. 361/679.57, 679.46, 679.49, 679.51, 361/679.52, 679.5; 700/300
See application file for complete search history.

(56) References Cited

U.S. PATENT DOCUMENTS

| | | | | |
|---|---|---|---|---|
| 8,248,793 B2* | 8/2012 | Bash et al. | | 361/695 |
| 8,300,410 B2* | 10/2012 | Slessman | | 361/691 |
| 8,405,977 B2* | 3/2013 | Lin | | 361/679.51 |
| 2008/0114500 A1* | 5/2008 | Hull et al. | | 700/300 |
| 2012/0138259 A1* | 6/2012 | Carlson | | 165/11.1 |
| 2012/0152777 A1* | 6/2012 | Lin | | 206/320 |
| 2012/0258654 A1* | 10/2012 | Peng et al. | | 454/184 |
| 2013/0008197 A1* | 1/2013 | Lin | | 62/186 |
| 2013/0062047 A1* | 3/2013 | Vaney et al. | | 165/287 |

* cited by examiner

Primary Examiner — Dameon Levi
Assistant Examiner — Keith Depew
(74) Attorney, Agent, or Firm — Altis Law Group, Inc.

(57) ABSTRACT

A container data center includes a container, servers, a monitoring device, a cooling system, and a controller. The container is divided into first regions and a second region which are separated from each other. The servers are received in the respective first regions. The monitoring device is for monitoring the servers and received in the second region. The cooling system includes a first generator for generating a first cool airflow, a second generator for generating a second cool airflow for the second region, an air pipe connecting the first regions and directing the first cool airflow to the first regions, and valves arranged in the air pipe. Each valve is positioned between each two adjacent first regions. The controller controls the first generator, the valves and the second generator.

11 Claims, 1 Drawing Sheet

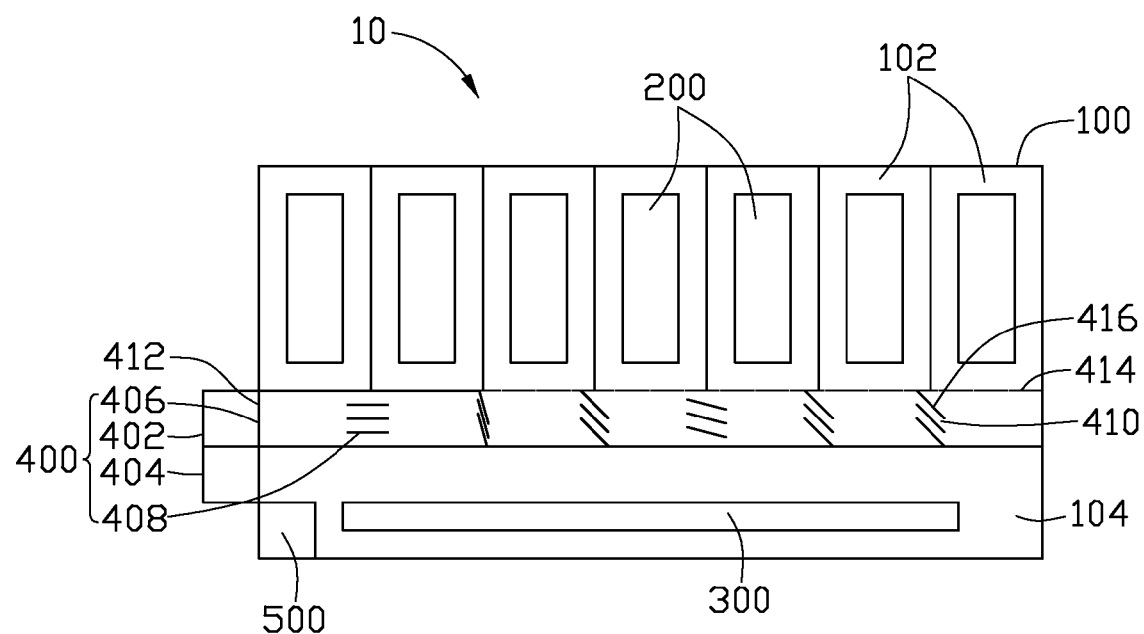

CONTAINER DATA CENTER HAVING HIGH HEAT DISSIPATING EFFICIENCY

BACKGROUND

1. Technical Field

The disclosure relates to container data centers (CDCs) and, particularly, to a CDC being efficient in heat dissipation.

2. Description of Related Art

Typical CDCs include a container, a number of servers, a monitoring device, and a cooling system. The servers and the monitoring device are both received in the container. The monitoring device monitors the servers. The cooling system generates cool air for dissipating heat generated by the servers and the monitoring device. However, current cooling system can not supply cool air to the servers and the monitoring device individually. As a result, the heat dissipation requirements of the servers and the monitoring device cannot both be met at the same time.

Therefore, it is desirable to provide a CDC, which can overcome the above-mentioned problems.

BRIEF DESCRIPTION OF THE DRAWING

Many aspects of the present disclosure can be better understood with reference to the following drawing. The components in the drawing are not necessarily drawn to scale, the emphasis instead being placed upon clearly illustrating the principles of the present disclosure.

The drawing is a schematic view of a CDC, according to an embodiment.

DETAILED DESCRIPTION

Embodiments of the present disclosure will now be described in detail with reference to the drawing.

Referring to FIG. 1, a CDC 10, according to an embodiment, includes a container 100, a number of servers 200, a monitoring device 300, a cooling system 400, and a controller 500. The container 100 is divided into a number of first regions 102, corresponding to the servers 200, and a second region 104 which are separated from each other. The servers 200 are received in the respective first regions 102. The monitoring device 300 is received in the second region 104. The cooling system 400 includes a first generator 402, a second generator 404, an air pipe 406, and a number of valves 408. The first generator 402 generates a first cool airflow that is directed into the first regions 102 and the second generator 404 generates a second cool airflow that is directed into the second region 104. The air pipe 406 connects the first regions 102 in series and directs the first cool airflow to the first regions 102. That is, the servers 200 are arranged in series along the air pipe 406 as being received in the first regions 102. The valves 408 are set in the air pipe 406 and each valve 408 is positioned between each two adjacent first regions 102. That is, the valves 408 are arranged in series along the air pipe 406. The controller 500 controls the first generator 402 and the second generator 404 to control the initial speed and the initial temperature of the first cool airflow and the second cool airflow to meet the heat dissipating requirements of the first regions 102 and the second region 104, respectively. The controller 500 also controls the valves 408 to control the flows of the first cool airflow flowing into the respective first regions 102 to meet the heat dissipating requirements of the respective first regions 102.

In this embodiment, the container 100 is substantially cuboid in shape. The first regions 102 and the second region 104 are positioned at two opposite lengthwise sides of the container 100. The first regions 102 are arranged along the lengthwise direction.

The first generator 402 and the second generator 404 can be air conditioners and are electrically connected to the controller 500. Thus, the controller 500 can controller the initial speed and the initial temperature of the first cool airflow and the second cool airflow.

The air pipe 406 is a rectangular pipe and forms an inlet 412 connecting with the first generator 402 and a number of outlets 414, each of which connects with a corresponding first region 102.

Each valve 408 includes a number of paralelly arranged slats 416. The angle of the slats 416 of each valve 408 can be controlled by the controller 500 to adjust an opening 410 of each valve 408.

In detail, the controller 500 controls the first generator 402 according to the formulas: $Ht=H1+\ldots Hn+\ldots Hm=f1(Q1t, T1)$ and $Q1t=A1*V1t$, where Ht is the rate of generating heat in the first regions 102, Hn is the rate of generating heat by the n-th server 200, m is the total number of the servers 200, Q1t is the initial flux of the first cool airflow, T1 is the initial temperature of the first cool airflow, $f1(Q1t, T1)$ is a function of Q1t and T1, A1 is the area of the inlet 412, and V1t is the initial speed of the first cool airflow.

Hn can be detected and sent to the controller 500 by various techniques, such as temperature sensors. Also, Hn can be input to the controller 500 by users reading the specification of the servers 200 or from experience. As such, Ht can be determined by the controller 500. $f1(Q1t, T1)$ is typically a linear function and the coefficients can be determined by theoretical calculations or experiments and thus can be recognized by the controller 500. In principle, $f1(Q1t, T1)$ is determined by target temperatures of the first regions 102, that is, the temperatures of the first regions 102 to be maintained. As such, Q1t and T1 can be determined by the controller 500, provided that Q1t or T1 is fixed by the users or automatically set by the controller 500. A1 can also be measured and recognized by the controller 500. As such, V1t can be determined by the controller 500 as well. In all, the controller 500 can control the initial speed and the initial temperature of the first cool airflow.

Similarly, the controller 500 controls the second generator 404 according to the formulas: $H=f2(Q2t, T2)$ and $Q2t=A2*V2t$, where H is the rate of generating heat in the second region 104, Q2t is the initial flux of the second cool airflow, T2 is the initial temperature of the second cool airflow, $f2(Q1t, T1)$ is a function of Q2t and T2, A2 is the area of a channel 418 communicating the second generator 404 with the second region 104, and V2t is the initial speed of the second cool airflow.

The controller 500 controls the valves 408 according to the formulas: $Hn=fn(Qn, T1)$ and $Qn=Anu*Vnu-And*Vnd$, where Qn is the flow of the first cool airflow to the n-th first region 102, $fn(Qn, T1)$ is a function of Qn and T1, Anu is the area of the opening 410 of the upstream valve 408 of the n-th first region 102, Vnu is the speed of the cool air passing the upstream valve 408 of the n-th first region 102, And is the area of the opening 410 of the downstream valve 408 of the n-th first region 102, Vnd is the speed of the cool air passing the downstream valve 408 of the n-th first region 102.

As discussed above, $fn(Qn, T1)$ can be determined and known by the controller 500. Thus, Qn can be determined accordingly. Vnu and Vnd can be calculated using the continuity equation and Bernoulli's equation and sent to the controller 500. As such, Anu and And can be calculated by the controller 500, that is, the valves 408 can be controlled accordingly.

Upon a condition that the speed and temperature of the air satisfy the heat dissipating requirements of the first regions 102 and/or the second region, the controller 500 can turn off the first generator 402 and/or the second generator 404 and introduces the air to the first regions 102 and the second region 404 for heat dissipation.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A container data center (CDC), comprising:
    a container divided into a plurality of first regions and a second region which are separated from each other;
    a number of servers received in the respective first regions;
    a monitoring device for monitoring the servers and received in the second region;
    a cooling system, comprising:
        a first generator for generating a first cool airflow;
        a second generator for generating a second cool airflow for the second region;
        an air pipe connecting the first regions in series and directing the first cool airflow to the first regions; and
        a plurality of valves arranged in the air pipe, each valve being positioned between each two adjacent first regions; and
    a controller controlling the first generator and the second generator to control an initial speed and an initial temperature of the first cool airflow and the second cool airflow so as to meet heat dissipating requirements of the first regions and the second region, respectively, the controller also controlling the valves to control the flows of the first cool airflow flowing into the respective first regions so as to meet the heat dissipating requirements of the respective first regions.

2. The CDC of claim 1, wherein the air pipe comprises an inlet connecting with the first generator and a number of outlets, each of which connects with a corresponding first region.

3. The CDC of claim 1, wherein each valve comprises a plurality of parallely arranged slats, the angle of the slats can be controlled by the controller to adjust an opening of each valve.

4. The CDC of claim 1, wherein the controller controls the first generator according to the formulas: $Ht=H1+\ldots Hn+\ldots Hm=f1(Q1t, T1)$ and $Q1t=A1*V1t$, where Ht is the rate of generating heat in the first regions, Hn is the rate of generating heat by the n-th server 200, m is the total number of the servers, Q1t is the initial flux of the first cool airflow, T1 is the initial temperature of the first cool airflow, $f1(Q1t, T1)$ is a function of Q1t and T1, A1 is the area of the inlet, and V1t is the initial speed of the first cool airflow.

5. The CDC of claim 4, wherein Hn is detected and sent to the controller by temperature sensors.

6. The CDC of claim 4, wherein Hn is input to the controller according to the specification of the servers.

7. The CDC of claim 4, wherein $f1(Q1t, T1)$ is a linear function and the coefficients thereof are determined by theoretical calculations or experiments.

8. The CDC of claim 1, wherein the controller controls the second generator according to the formulas: $H=f2(Q2t, T2)$ and $Q2t=A2*V2t$, where H is the rate of generating heat in the second region, Q2t is the initial flux of the second cool airflow, T2 is the initial temperature of the second cool airflow, $f2(Q1t, T1)$ is a function of Q2t and T2, A2 is the area of a channel communicating the second generator with the second region, and V2t is the initial speed of the second cool airflow.

9. The CDC of claim 1, wherein the controller controls the valves according to the formulas: $Hn=fn(Qn, T1)$ and $Qn=Anu*Vnu-And*Vnd$, where Qn is the flow of the first cool airflow flowing into the n-th first region, T1 is the initial temperature of the first cool airflow, $fn(Qn, T1)$ is a function of Qn and T1, Anu is the area of an opening of the upstream valve of the n-th first region, Vnu is the speed of the cool airflow passing the upstream valve of the n-th first region, And is the area of an opening of the downstream valve of the n-th first region, Vnd is the speed of the cool airflow passing the downstream valve of the n-th first region.

10. The CDC of claim 1, wherein the controller turns off the first generator and introduces the air to the first regions upon a condition that the speed and temperature of the air satisfy the heat dissipating requirements of the first regions.

11. The CDC of claim 1, wherein the controller turns off the second generator and introduces the air to the second region upon a condition that the speed and temperature of the air satisfy the heat dissipating requirements of the second region.

* * * * *